United States Patent
Leigh et al.

[11] Patent Number: 6,107,907
[45] Date of Patent: *Aug. 22, 2000

[54] HIGH CURRENT FERRITE ELECTROMAGNETIC INTERFERENCE SUPRESSOR AND ASSOCIATED METHOD

[75] Inventors: William C. Leigh, Green Valley, Ariz.; Stephen S. Deakins, Harrison, Tenn.

[73] Assignee: Steward, Inc., Chattanooga, Tenn.

[*] Notice: This patent is subject to a terminal disclaimer.

[21] Appl. No.: 09/166,371

[22] Filed: Oct. 5, 1998

Related U.S. Application Data

[63] Continuation of application No. 08/445,475, May 22, 1995, Pat. No. 5,821,846.

[51] Int. Cl.⁷ .................................................... H01F 5/00
[52] U.S. Cl. ........................... 336/200; 336/223; 336/232
[58] Field of Search .................................... 336/200, 232, 336/223

[56] References Cited

U.S. PATENT DOCUMENTS

| | | |
|---|---|---|
| 2,998,840 | 9/1961 | Davis . |
| 3,505,139 | 4/1970 | Wentworth . |
| 3,948,706 | 4/1976 | Schmeckenbecher . |
| 4,497,677 | 2/1985 | Sanada et al. . |
| 4,543,553 | 9/1985 | Mandai et al. ............................. 336/83 |
| 4,586,972 | 5/1986 | Yokotani et al. . |
| 4,641,425 | 2/1987 | Dubuisson et al. ....................... 29/830 |
| 4,689,594 | 8/1987 | Kawabata et al. ...................... 336/200 |
| 4,772,985 | 9/1988 | Yasumoto et al. ...................... 361/321 |
| 4,806,188 | 2/1989 | Rellick . |
| 4,994,302 | 2/1991 | Kellerman ................................ 427/96 |
| 5,006,182 | 4/1991 | Gantzhorn, Jr. et al. . |
| 5,176,772 | 1/1993 | Ohtaki . |
| 5,251,108 | 10/1993 | Doshita ................................... 361/792 |
| 5,278,526 | 1/1994 | Ikeda ....................................... 333/185 |
| 5,302,932 | 4/1994 | Person et al. ........................... 336/200 |
| 5,386,206 | 1/1995 | Iwatani et al. .......................... 336/200 |
| 5,479,695 | 1/1996 | Grader et al. .......................... 29/602.1 |
| 5,499,005 | 3/1996 | Gu et al. ................................. 333/246 |
| 5,515,022 | 5/1996 | Tashiro et al. .......................... 336/200 |
| 5,525,941 | 6/1996 | Roshen et al. .......................... 333/112 |
| 5,532,667 | 7/1996 | Haertling et al. ....................... 336/177 |

*Primary Examiner*—Michael L. Gellner
*Assistant Examiner*—Anh Mai
*Attorney, Agent, or Firm*—Allen, Dyer, Doppelt, Milbrath & Gilchrist, P.A.

[57] ABSTRACT

An electromagnetic interference suppressor includes a plurality of ferrite layers arranged in stacked relation and defining a generally rectangular ferrite body. Each ferrite layer includes a laterally extending electrical conductor including an elongate portion and at least one enlarged width portion connected thereto. The enlarged width portion permits connection to an adjacent lateral conductor by one or more tubular vertical conductors which extend through respective via openings in a ferrite layer. The tubular vertical conductor and enlarged width portions permit high current carrying capability and permit greater manufacturing tolerance in the assembly of adjacent layers and in forming the tubular vertical conductors. An associated method is also disclosed.

24 Claims, 4 Drawing Sheets

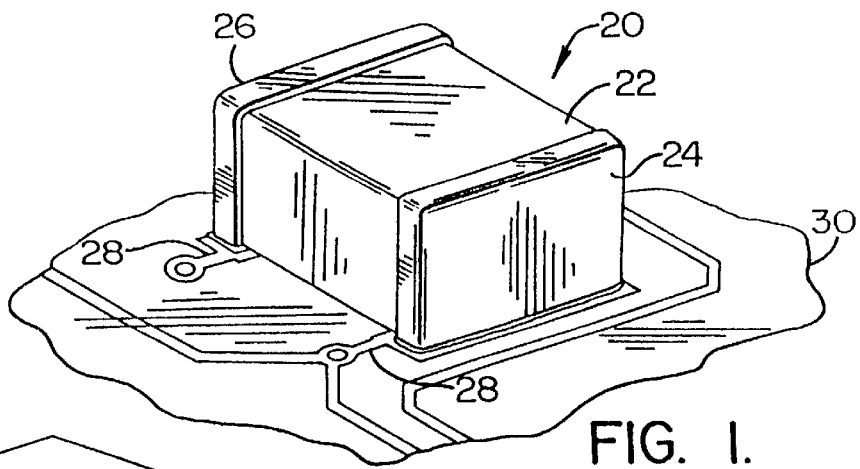
FIG. 1.
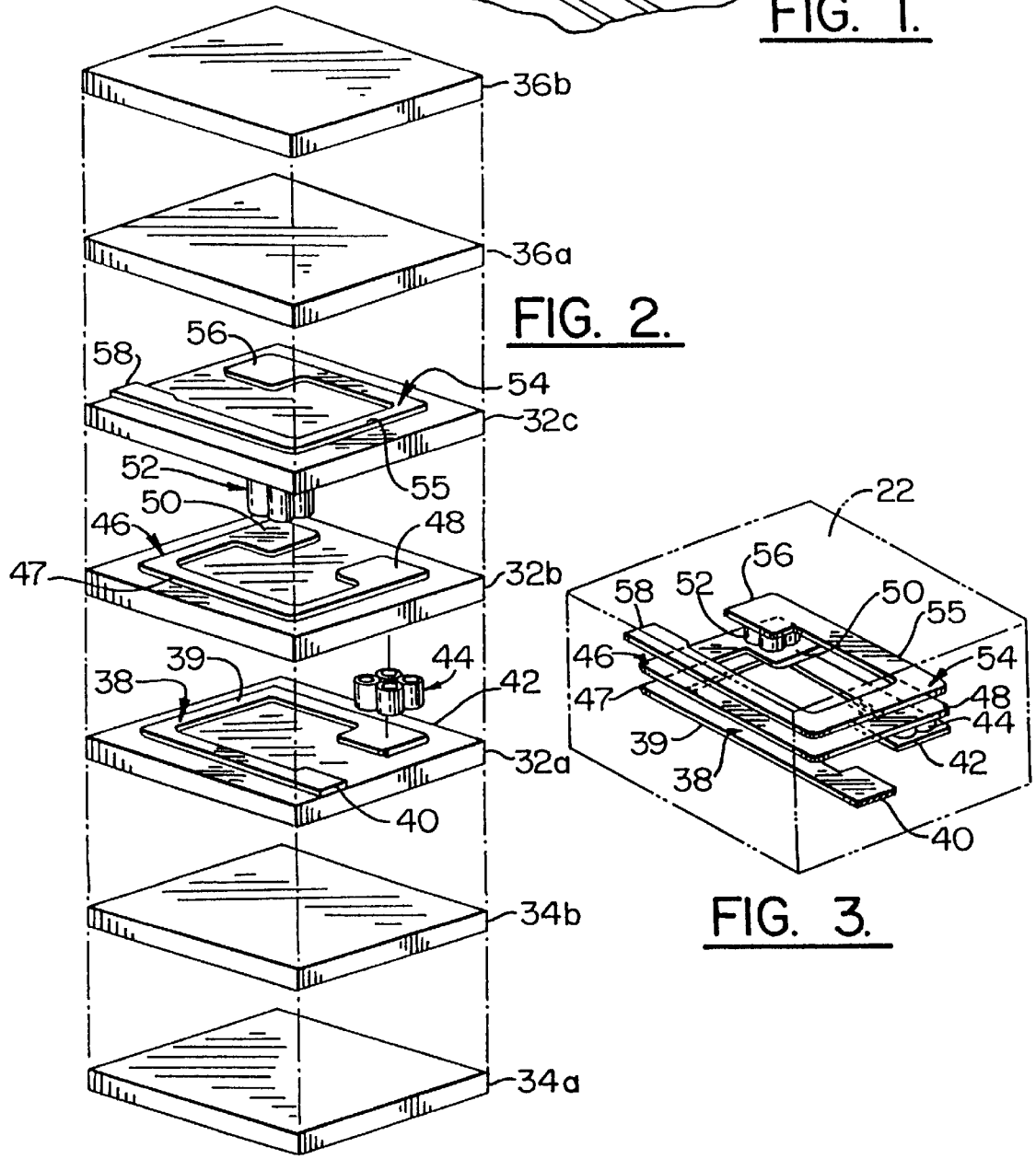
FIG. 2.
FIG. 3.

HIGH CURRENT FERRITE ELECTROMAGNETIC INTERFERENCE SUPRESSOR AND ASSOCIATED METHOD

This application is a continuation of Ser. No. 08/445,475 filed on May 22, 1995 as U.S. Pat. No. 5,821,846.

FIELD OF THE INVENTION

This invention related to the field of electronic devices, and more particularly to the field of ferrite electromagnetic interference suppressors.

BACKGROUND OF THE INVENTION

A typical ferrite surface mount electro-magnetic interference ("EMI") suppressor includes a generally rectangular ferrite body with an electrically conductive path extending therethrough. The electrically conductive path, in turn, is connected to respective conductive coating layers on opposite ends of the ferrite body to facilitate connection to a printed circuit board, for example. Such a ferrite EMI suppressor may commonly be manufactured by printing a plurality of interconnected conductive traces on successive stacked ferrite layers.

U.S. Pat. No. 4,543,553 to Mandai et al. entitled "Chip-Type Inductor" discloses a chip inductor comprising a plurality of laminated magnetic layers. Linear conductive patterns extend between the respective magnetic layers, and these linear conductive patterns are connected successively to define a coil so as to produce an inductance component. The conductive patterns on opposite surfaces of the magnetic layers are connected to each other by through-holes wherein the conductors are deformed to plunge through the holes to establish electrical contact.

Another device is disclosed in U.S. Pat. No. 4,689,594 to Kawabata et al. entitled "Multi-Layer Chip Coil." In this patent a multi-layer chip coil comprises a stack of intermediate laminas of magnetizable material having a through-hole defined therein so as to extend completely through the thickness thereof. First and second patterned electrical conductors are formed on the opposite surfaces of each of the intermediate laminas, and a hollow tubular conductive layer extends through the through-hole so as to connect adjacent conductors.

Still another device is disclosed in U.S. Pat. No. 5,302,932 to Person et al. entitled "Monolithic Multilayer Chip Inductor and Method For Making Same." This patent discloses a monolithic multilayer chip inductor which includes a plurality of subassemblies stacked one above another. Each of the intermediate subassemblies includes a ferrite layer having a coil conductor with a uniform width printed on its upper surface. The intermediate ferrite layers include via holes therein for permitting interconnection of the conductor coils from one layer to the other. Unfortunately, great accuracy may be required in assembling the layers to provide sufficient electrical contact between each vertical conductor and the relatively narrow lateral conductors. In addition, one end of the top coil conductor is exposed adjacent the edge of the chip, and one end of the bottom coil conductor is exposed adjacent another end of the chip so that the conductors can be connected to end terminals.

Conventional chip type, surface mount, ferrite EMI suppressors are commonly manufactured by screen printing a plurality of conductive traces on a relatively rigid base ferrite tape, and positioning a second relatively rigid ferrite tape thereon. The thus formed multilayer structure is heated under pressure to form a monolithic structure. Unfortunately, the conventional screen printing process limits the thickness of the electrically conductive material, typically a silver or other precious metal paste. The thickness of the conductive path may be only 0.2 mils (0.0002– or about 5.0 $\mu$m). Accordingly, the current carrying capability of such a device may be severely limited, that is, on the order of only several milliamperes.

Steward Inc., the assignee of the present invention, developed an EMI suppressor for higher currents and including enlarged pads at the ends of U-shaped laterally extending conductors on intermediate ferrite layers. Vertical conductors were provided by one or more solid conductors completely filling an associated vertical opening in the ferrite layer. Top and bottom lateral conductors had end portions connected to respective overall opposing end caps on the ferrite body. Unfortunately, the relatively small dimensions and manufacturing tolerances often made it difficult to mass produce the suppressors having solid vertical conductors without voids.

Notwithstanding the above mentioned references, there continues to exist a need in the art for ferrite EMI suppressors capable of handling relatively large currents. For example, applications such as DC-to-DC converters and disc drives may require suppression of electromagnetic interference at current levels of up to about 6 amps continuously, and to surge levels of about 10 amps. In addition, automated mass production of such devices is also a concern.

SUMMARY OF THE INVENTION

In view of the foregoing background, it is therefore an object of the present invention to provide an EMI suppressor, particularly of the surface mount type, for carrying a relatively high current that is readily manufacturable.

This and other objects, features, and advantages of the present invention are provided by an EMI suppressor comprising a plurality of ferrite layers arranged in stacked relation and joined together to define a generally rectangular ferrite body. Each ferrite layer includes a laterally extending electrical conductor including an elongate portion and at least one enlarged width portion connected thereto. The enlarged width portion permits connection to an adjacent lateral conductor by at least one relatively large tubular vertical conductor which extends through a respective via opening in the ferrite layer. The tubular vertical conductor preferably includes a cross-sectional area larger than a cross-sectional area of an elongate portion of the lateral electrical conductor and, more preferably, twice as large as the cross-sectional area of the elongate portion. Accordingly, the enlarged width portions and tubular vertical conductors permit high current carrying capability and permit a greater manufacturing tolerance in assembling adjacent layers and in covering the interior wall portions of the vertical via openings with conductive material to form the tubular vertical conductors.

The EMI suppressor preferably includes a lower ferrite layer, one or more intermediate ferrite layers, and an upper ferrite layer. A lower electrical conductor extends laterally along the lower ferrite layer and comprises an elongate portion having a first end terminating at a first end of the generally rectangular body, and an enlarged width portion connected to a second end of the elongate portion. An intermediate ferrite layer is on the lower ferrite layer and has at least one first via opening extending vertically therethrough and in substantial registry with the enlarged width portion of the lower conductor. A first tubular vertical electrical conductor extends through and defines an electrically conductive layer covering the interior wall portions of a respective via opening of the intermediate ferrite layer. An intermediate electrical conductor extends laterally along the intermediate ferrite layer. The intermediate conductor includes a first enlarged width portion overlying the first tubular vertical conductor or conductors and is connected thereto. The intermediate conductor also includes an elongate portion having a first end connected to the first enlarged width portion, and a second enlarged width portion connected to a second end of the elongate portion. More than one such intermediate ferrite layer and intermediate conductor may be provided to increase the length of the overall conductive path through the ferrite body.

The upper ferrite layer preferably has at least one second via opening extending vertically therethrough and in registry with the enlarged width portion of an adjacent intermediate conductor. Similarly, a second tubular vertical electrical conductor extends through and covers the interior wall portions of a respective via opening of the upper ferrite layer. An upper electrical conductor extends laterally along the upper ferrite layer and comprises an enlarged width portion overlying the second tubular vertical electrical conductor or conductors and is connected thereto. The upper electrical conductor also includes an elongate portion having a first end connected to the enlarged width portion and a second end terminating at a second end of the generally rectangular body.

To permit connection to a circuit board, for example, the EMI suppressor also preferably includes a pair of electrical conductors on respective first and second ends of the generally rectangular ferrite body and connected to respective ends of the elongate portions of the lower and upper conductors.

The elongate portions of the lower, intermediate, and upper conductors each preferably defines a predetermined cross-sectional area for carrying a relatively high current. In addition, each of the first and second tubular vertical conductors defines a cross-sectional area at least as great as the predetermined cross-sectional area of the elongate portion of the conductors. A preferred predetermined cross-sectional area for the elongate conductor portion comprising silver or other low resistance metal or alloy, for example, is not less than about $2 \times 10^{-4}$ cm$^2$. Further, each of the elongate portions of the lower, intermediate, and upper conductors has a thickness in the vertical direction greater than about 0.08 times a width thereof to facilitate manufacturing, while providing high current handling capability.

The elongate portion of each of the lower, intermediate and upper conductors is also preferably generally U-shaped defining three generally linear segments having outer edges spaced inward from adjacent edges of a respective ferrite layer. In addition, each enlarged width portion of the lower, intermediate, and upper conductors is generally rectangular having an outer edge generally aligned with the adjacent outer edge of the elongate portion.

Each of the enlarged width portions of the lower, intermediate, and upper conductors are preferably generally rectangular. Accordingly, each of the first and second tubular vertical conductors may number four or more and be relatively positioned so as to define four corners of an imaginary rectangle lying within the generally rectangular shape of the enlarged width conductor portions.

Stated in other terms, the EMI suppressor preferably comprises a plurality of ferrite layers arranged in stacked relation and joined together defining a generally rectangular ferrite body. An intermediate one of the plurality of ferrite layers has at least one via opening extending vertically therethrough, and a respective tubular vertical electrical conductor extends through and covers the interior wall portions of the via opening. An intermediate electrical conductor extends laterally on the intermediate ferrite layer. Moreover, the intermediate electrical conductor comprises a first enlarged width portion substantially overlying the at least one tubular vertical electrical conductor and is connected thereto, and an elongate portion having a first end connected to the first enlarged width portion. The intermediate conductor also includes a second enlarged width portion connected to a second end of the elongate portion to permit connection to an adjacent or upper electrical conductor. The elongate portion of the intermediate conductor defines a predetermined cross-sectional area for carrying a relatively high current therethrough, and the at least one tubular vertical conductor defines a cross-sectional area at least as great as the predetermined cross-sectional area of the elongate portion. More preferably, the at least one tubular vertical electrical conductor defines a cross-sectional area at least about twice as great as the predetermined cross-sectional area of the elongate portion of the intermediate electrical conductor.

A method aspect of the invention is for making the electromagnetic interference suppressor for carrying a relatively high current. The method includes the steps of: providing a plurality of ferrite layers, and forming at least one via opening extending vertically through an intermediate one of the ferrite layers. The method also includes the steps of: covering interior wall portions of the at least one via opening of the intermediate ferrite layer with a conductive material to thereby define a respective tubular vertical electrical conductor; and forming an intermediate electrical conductor extending laterally on the intermediate ferrite layer comprising a first enlarged width portion substantially overlying the at least one tubular vertical electrical conductor and being connected thereto, an elongate portion having a first end connected to the first enlarged width portion, and a second enlarged width portion connected to a second end of the elongate portion. The elongate portion of the intermediate conductor is preferably formed to define a predetermined cross-sectional area for carrying a relatively high current therethrough and the at least one tubular vertical conductor preferably defines a cross-sectional area at least as great as the predetermined cross-sectional area of the elongate portion of the intermediate electrical conductor. The method also preferably includes the step of arranging the plurality of ferrite layers in stacked relation and joining the ferrite layers together to define the generally rectangular ferrite body.

The method also preferably comprises the steps of forming a lower electrical conductor on a lower ferrite layer, forming an upper electrical conductor on an upper ferrite layer, and connecting the lower and upper electrical conductors to the intermediate conductor. In addition, the method preferably further includes forming a pair of electrical conductors on opposite ends of the ferrite body and connected to the lower and upper electrical conductors to facilitate surface mounting of the electromagnetic interference suppressor.

BRIEF DESCRIPTION OF THE DRAWINGS

FIG. 1 is a perspective view of an embodiment of an electromagnetic interference suppressor according to the present invention mounted on a printed circuit board.

FIG. 2 is an exploded perspective view of the EMI suppressor of FIG. 1.

FIG. 3 is an enlarged fragmentary view of the EMI suppressor of FIG. 1 with a portion of the ferrite removed to illustrate interconnection of the electrical conductors.

DETAILED DESCRIPTION OF PREFERRED EMBODIMENTS OF THE INVENTION

Figure 4:
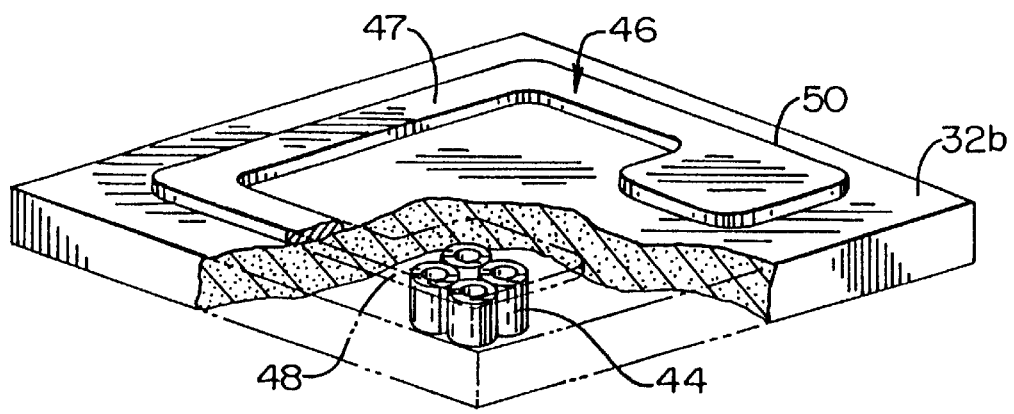
FIG. 4 is a greatly enlarged fragmentary view of an individual ferrite layer and electrical conductor of the EMI suppressor of FIG. 1.

The present invention will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Referring first to FIGS. 1–4, an embodiment of the ferrite electromagnetic interference ("EMI") suppressor 20 according to the present invention is first described. As shown, the EMI suppressor 20 includes a generally rectangular ferrite body 22 formed of a plurality of ferrite layers arranged in stacked relation and joined together. The suppressor 20 also includes a pair of electrical conductors 24 and 26 on respective first and second opposing ends of the generally rectangular ferrite body 22. These electrical conductors 24 and 26 facilitate electrical and mechanical connection of the EMI suppressor 20 to the conductive traces 28 of the printed circuit board 30 in a surface mount configuration as illustrated.

The ferrite body 22 of the EMI suppressor is made up of a plurality of ferrite layers 32a–c, 34a–b, and 36a–b arranged in stacked relation and joined or fused together as would be readily understood by those skilled in the art. The ferrite material may be a nickel zinc or a manganese zinc ferrite as would also be understood by those skilled in the art.

A lower electrical conductor 38 extends laterally along a lower ferrite layer 32a and comprises an elongate portion 39 having a first end 40 terminating at a first end of the generally rectangular body, and an enlarged width portion 42 connected to a second end of the elongate portion. An intermediate ferrite layer 32b is on the lower ferrite layer 32a and has a first plurality of spaced apart via openings extending vertically therethrough and in registry with the enlarged width portion of the lower conductor 38. A first plurality of tubular vertical electrical conductors 44 extends through and covers interior wall portions of respective via openings of the intermediate ferrite layer.

An intermediate electrical conductor 46 extends laterally along the intermediate ferrite layer 32b. The intermediate conductor 46 includes a first enlarged width portion 48 overlying the first plurality of tubular vertical conductors 44 and connected thereto; an elongate portion 47 having a first end connected to the first enlarged width portion 48; and a second enlarged width portion 50 connected to a second end of the elongate portion 47. More than one such intermediate ferrite layer and intermediate conductor may be provided to increase the length of the overall conductive path through the ferrite body as would be readily understood by those skilled in the art. Moreover, a single via opening and respective single tubular vertical conductor for each ferrite layer may also be used in addition to the plural arrangement illustrated.

The illustrated EMI suppressor 20 includes an upper ferrite layer 32c on the intermediate ferrite layer 32b. The upper ferrite layer 32c has a second plurality of spaced apart via openings extending vertically therethrough and in registry with the second enlarged width portion 50 of the intermediate conductor 46. Similarly, a second plurality of tubular vertical electrical conductors 52 extends through respective via openings of the upper ferrite layer 32c. An upper electrical conductor 54 extends laterally along the upper ferrite layer 32c and comprises an enlarged width portion 56 overlying the second plurality of tubular vertical conductors 52 and is connected thereto. An elongate portion 55 has a first end connected to the enlarged width portion 56 and a second end 58 terminating at a second end of the generally rectangular body. The lower protective ferrite layers 34a–b and upper protective ferrite layers 36a–b increase the physical strength of the suppressor, as well as enhance the suppression performance.

The assembled EMI suppressor 20 also preferably includes a pair of electrical conductors 24 and 26 on respective first and second ends of the generally rectangular ferrite body 22. These electrical conductors are connected to respective ends 40 and 58 of the elongate portions of the lower and upper conductors 38 and 54. These conductors 24 and 26 permit electrical connection from the respective ends 40 and 58 of the lower 38 and upper 54 conductors of an assembled EMI suppressor to the traces 28 of a printed circuit board 30, for example. The end conductors 24 and 26 are preferably formed of an alloy comprising silver or other low resistance metal or alloy, for example, as would be readily understood by those skilled in the art.

Each of the respective elongate portions 39, 47, and 55 of the lower conductor 38, intermediate conductor 46, and upper conductor 54 preferably defines a predetermined cross-sectional area for carrying a relatively high current of up to 6 amps continuously and 10 amps in surges. In addition, each of the illustrated first 44 and second 52 pluralities of tubular vertical conductors preferably defines a collective cross-sectional area at least as great as the predetermined cross-sectional area of the elongate portions of the lateral conductors. A preferred predetermined cross-sectional area for a conductor comprising silver, for example, is not less than about $2 \times 10^{-4}$ cm$^2$. This cross-sectional area allows the conduction of the relatively high currents. Furthermore, each of the elongate portions 39, 47, and 55 of the lower conductor 38, intermediate conductor 46, and upper conductor 54 preferably has a thickness in the vertical direction of greater than about 0.08 times a width thereof to facilitate manufacturing while providing high current handling capability.

The elongate portion 39, 47, and 55 of each of the lower conductor 38, intermediate conductor 46 and upper conductor 54 is also preferably generally U-shaped defining three generally linear segments having outer edges adjacent and closely spaced inward from corresponding edges of a respective ferrite layer as illustrated. In addition, each respective enlarged width portion of the lower, intermediate, and upper conductors is generally rectangular having an outer edge generally aligned with the adjacent outer edge of the elongate portion. This arrangement provides an increased conductor path for a ferrite layer having a predetermined size.

Each of the first and second plurality of tubular vertical conductors 44 and 54 may be at least four in number and relatively positioned so as to define four corners of an imaginary rectangle lying within the generally rectangular shape of the enlarged width portions 42, 48, 50, and 56. Accordingly, two of the tubular vertical conductors can be misaligned relative to the enlarged width portion without significantly affecting the performance of the EMI suppressor. Stated in different terms, the cross-sectional area of the one or more tubular vertical conductors is more preferably at least about twice as great as the cross-sectional area of the elongate conductor portion. Accordingly, about half of the cross-sectional area of the one or more tubular vertical conductors may be misaligned yet the EMI suppressor still provides the relatively high current carrying capacity. The enlarged width portion in combination with the relatively large cross-sectional area of the one or more tubular vertical conductors provides tolerance for the alignment of the ferrite layers and conductors. In addition, the tubular vertical conductors are more readily and consistently formed by automated production techniques than solid vertical conductors.

Each via opening of the first and second pluralities of via openings, and the respective tubular vertical conductors is generally circular in cross-sectional shape in the illustrated embodiment. For example, for the embodiment including four via openings and associated tubular vertical conductors, each may be about 0.015 cm in diameter. Square, rectangular and other shapes are also contemplated by the invention for the via openings and associated tubular vertical conductors as would be readily understood by those skilled in the art.

While the illustrated EMI suppressor 20 has only a single intermediate ferrite layer 32b and electrical conductor 46, it will be understood by those having skill in the art that a plurality of intermediate ferrite layers and electrical conductors may be used. Accordingly, the length of the conductor path from the first end 40 of the lower conductor path 38 to the second end 58 of the upper electrical conductor 54 depends on the number of intermediate electrical conductors included.

With a plurality of intermediate electrical conductors, each intermediate electrical conductor includes first and second enlarged width portions at each end thereof. Each enlarged width portion is connected to a corresponding enlarged width portion of an adjacent electrical conductor. This connection is established through one or more tubular vertical conductors and associated via openings as discussed above.

An individual intermediate ferrite layer 32b and intermediate electrical conductor 46 are shown in FIG. 4. As discussed above, the electrical conductor 46 extends laterally along the intermediate ferrite layer 32b. This electrical conductor includes a first enlarged width portion 48, an elongate portion having a first end connected to the first enlarged width portion, and a second end connected to a second enlarged width portion 50. The ferrite layer has a plurality of spaced apart via openings extending vertically therethrough, and these via openings are substantially in registry with the enlarged width portion of the lower electrical conductor. Interior wall portions of the via openings are covered with an electrically conductive material defining a plurality of tubular vertical electrical conductors 44, and these tubular vertical electrical conductors are connected to the first enlarged width portion 48.

The via openings are preferably formed in the ferrite layer by a punch and the wall portions covered with a conductive material, such as silver, to form the plurality of tubular vertical electrical conductors 44. In the illustrated embodiment, four tubular vertical electrical conductors are formed, and these four conductors are arranged to form an imaginary rectangle. This imaginary rectangle is formed so as to lie within the generally rectangular shape of the enlarged width portions of the electrical conductor above and below. Accordingly, some misalignment between the tubular vertical conductors 44 and the corresponding enlarged width portions can be tolerated. The tubular vertical conductors may be sized to have a sufficient cross-sectional area such that even if two of the four tubular vertical conductors were misaligned relative to the enlarged width portion, the performance of the suppressor would not be degraded.

Figure 5:
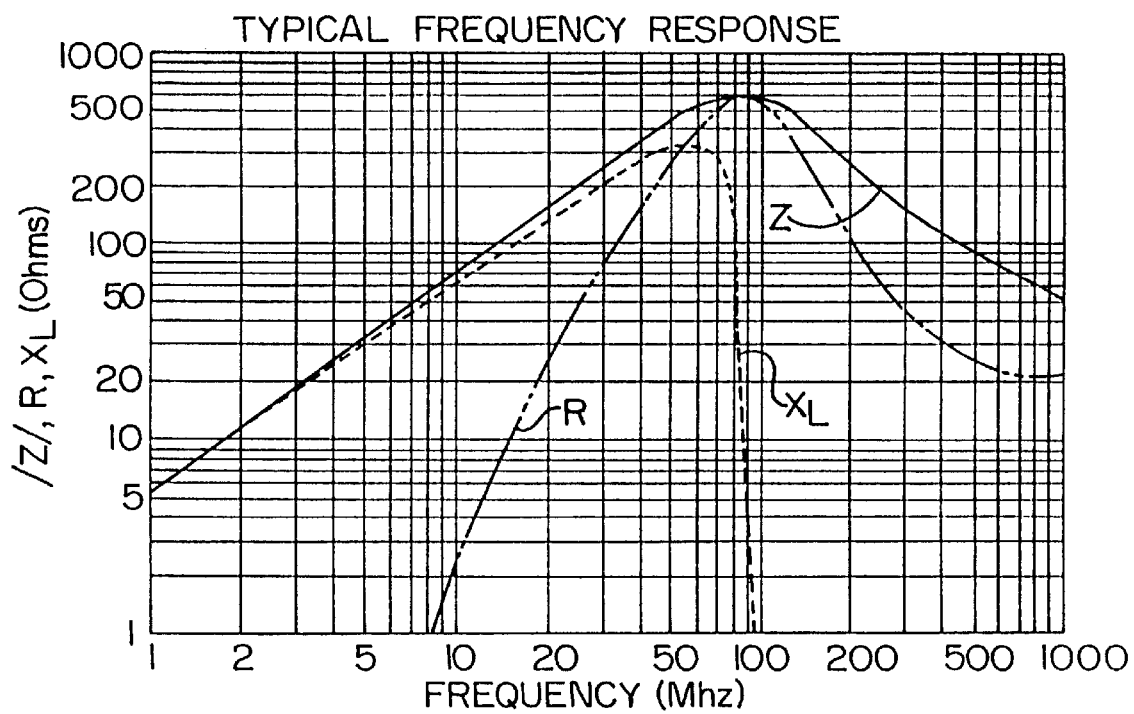
FIG. 5 is a graph of impedance versus frequency for the EMI suppressor according to the present invention.

The typical frequency response of an EMI suppressor 20 according to the invention is graphically illustrated in FIG. 5. The vertical axis represents the impedance [Z], the resistance R, and the reactance $X_L$ in units of Ohms. The impedance is indicated by the solid line, the resistance is indicated by the line with intermittent dashes, and the reactance is indicated by the dashed line. The horizontal axis represents the frequency in units of Mhz. As would be readily understood by those skilled in the art, the EMI suppressor 20 may be used in a wide variety of applications to filter high frequency noise signals.

A method for making an electromagnetic interference suppressor for carrying a relatively high current is described with reference additionally to FIGS. 6–9. This method comprises the step of providing a plurality of ferrite layers 32a–c, 34a–b, and 36a–b. A first electrical conductor 38 is formed on a first ferrite layer 32a and extends laterally along the first ferrite layer 32a. This first electrical conductor 38 is formed to have an elongate portion 39, and an enlarged width portion 42 connected to an end of the elongate portion 39.

A first plurality of spaced apart via openings is formed in a second ferrite layer 32b on the first ferrite layer 32a. These via openings are formed to extend vertically through the second ferrite layer 32b. This first plurality of via openings is also formed substantially in registry with the enlarged width portion 42 of the first conductor 38. Interior wall portions of the respective via openings of the second ferrite layer 32b are covered with an electrically conductive material to form a first plurality of tubular vertical electrical conductors 44 extending therethrough. The thickness of the layer may be about 0.002", for example. Moreover, a single via opening and respective single tubular vertical conductor for each ferrite layer may also be used in addition to the plural arrangement illustrated.

A second electrical conductor 46 is formed on the second ferrite layer 32b. This second electrical conductor is formed to extend laterally along the second ferrite layer 32b. This second electrical conductor 46 is formed to have a first enlarged width portion 48 overlying the first plurality of tubular vertical conductors 44 and is connected thereto. In addition, an elongate portion 47 of the second electrical conductor 46 is formed to have a first end connected to the first enlarged width portion 48. The step of forming the second conductor 46 preferably comprises forming same to have a second enlarged width portion 50 connected to an opposite end of the elongate portion.

This method may also include the step of forming a second plurality of spaced apart via openings extending vertically through a third ferrite layer 32c on the second ferrite layer 32b, and this second plurality of via openings is formed substantially in registry with the second enlarged width portion 50 of the second conductor 46. The interior wall portions of the respective via openings of the second ferrite layer 32b are covered with an electrically conductive material to form a second plurality of tubular vertical electrical conductors 52 extending therethrough. A third electrical conductor 54 is formed extending laterally along the third ferrite layer 32c. This third electrical conductor 54 is formed to have an enlarged width portion 56 overlying the second plurality of tubular vertical conductors 52 and is connected thereto. In addition, the third electrical conductor 54 is formed to include an elongate portion 55 having a first end connected to the enlarged width portion 56.

In this method, the steps of forming the first 38, second 46 and third 54 electrical conductors preferably comprise forming same so that each of the elongate portions of the first, second, and third conductors defines a predetermined cross-sectional area for carrying a relatively high current. This predetermined cross-sectional area is preferably at least about $2 \times 10^{-4}$ cm$^2$. In addition, the step of forming the first and second plurality of spaced apart vias preferably comprises the step of forming same so that the first 44 and second 52 pluralities of tubular vertical conductors define collective cross-sectional areas at least as great as the predetermined cross-sectional area, and, more preferably, at least two times as great as the predetermined cross-sectional area. The steps of forming the first, second, and third electrical conductors 38, 46 and 54, may comprise the steps of forming same so that each of the elongate portions of the first, second, and third conductors has a thickness in the vertical direction greater than about 0.08 times a width thereof.

The steps of forming the first, second, and third electrical conductors preferably comprise the steps of forming same so that each is generally U-shaped defining three generally linear segments having outer edges spaced inward from adjacent edges of a respective ferrite layer to thereby define a relatively long path along the generally rectangular ferrite layer. The steps of forming the first, second, and third electrical conductors may comprise the steps of forming same so that each enlarged width portion of the first, second, and third conductors is generally rectangular having an outer edge generally aligned with the adjacent outer edge of the elongate portion.

The steps of forming the first 38, second 46, and third 54 electrical conductors may comprise the steps of forming same so that each of the enlarged width portions 42, 48, 50, and 56 of the first, second, and third conductors are generally rectangular. Accordingly, the steps of forming the first and second pluralities of spaced apart via openings and covering the interior wall portions of the respective via openings comprise the steps of forming and covering same so that the first 44 and second 52 pluralities of tubular vertical electrical conductors are at least four in number and relatively positioned so as to define four corners of an imaginary rectangle lying within the generally rectangular shape of the respective enlarged width portions 48 and 56.

The step of providing a plurality of ferrite layers 32a–c may comprise the step of providing ductile ferrite tape layers, and the step of forming electrical conductors 38, 46, and 54 may comprise the step of forming metal conductors on the order of 0.001 to 0.005 inches thick. The metal conductors may be formed by screen printing a thick emulsion of a precious metal and a binder onto a respective ferrite layer. Accordingly, when the ferrite layers are assembled, the ductile ferrite tape molds around the relatively thick metal conductors. This ductile ferrite tape may be provided by a roll compaction process.

The roll compaction process includes the steps of mixing ferrite powder with an organic binder and passing the mixture through high-shear forming rolls to thereby form a tape having a width of from 3 to 8 inches. More particularly, the compacted roll tape is flexible, and the flexibility of the tape is dependent upon the specific binder. The tape is also relatively thick, on the order of 20 to 30 mils. The thickness of the tape enhances performance of the suppressor.

Figure 6:
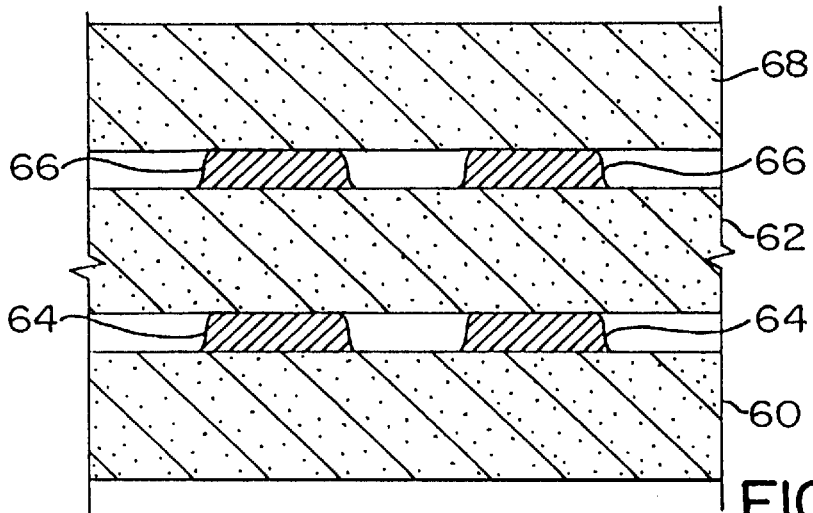
FIGS. 6–8 are schematic cross-sectional views illustrating the steps of assembling ferrite layers and relatively thick electrical conductors according to the invention.

A process of assembling layers of ductile ferrite tape is illustrated in FIGS. 6 to 9. For example, first and second ferrite layers 60 and 62 are respectively provided with relatively thick first and second electrical conductors 64 and 66. The second ferrite layer 68 is then placed over the second ferrite layer 62 and second electrical conductor 66, as shown in FIG. 6. As will be readily understood by those skilled in the art, any number of ferrite layers and electrical conductors can be arranged as illustrated.

Figure 7:
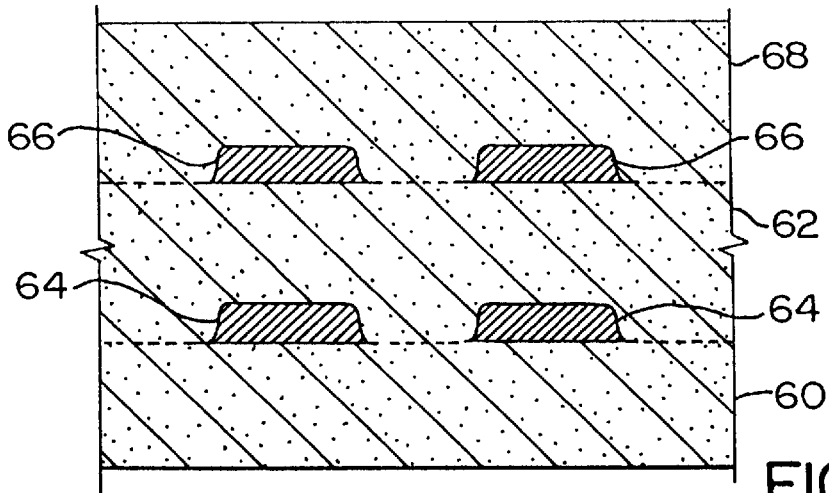
Figure 8:
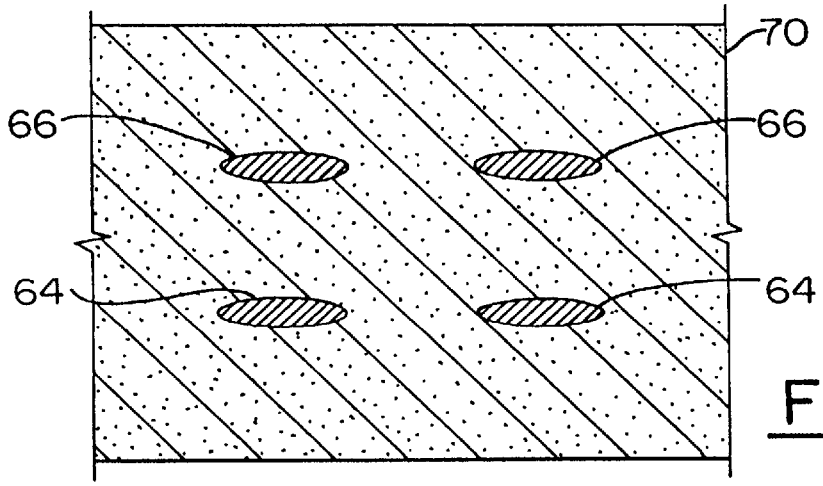

Pressure is then applied to the structure and the ferrite layers 60, 62, and 68 mold around the electrical conductors 64 and 66, as shown in FIG. 7. The pressure can be applied by loading the structure into a laminating die. Heat is also applied so that the structure forms a monolithic block 70, as shown in FIG. 8.

Figure 9:
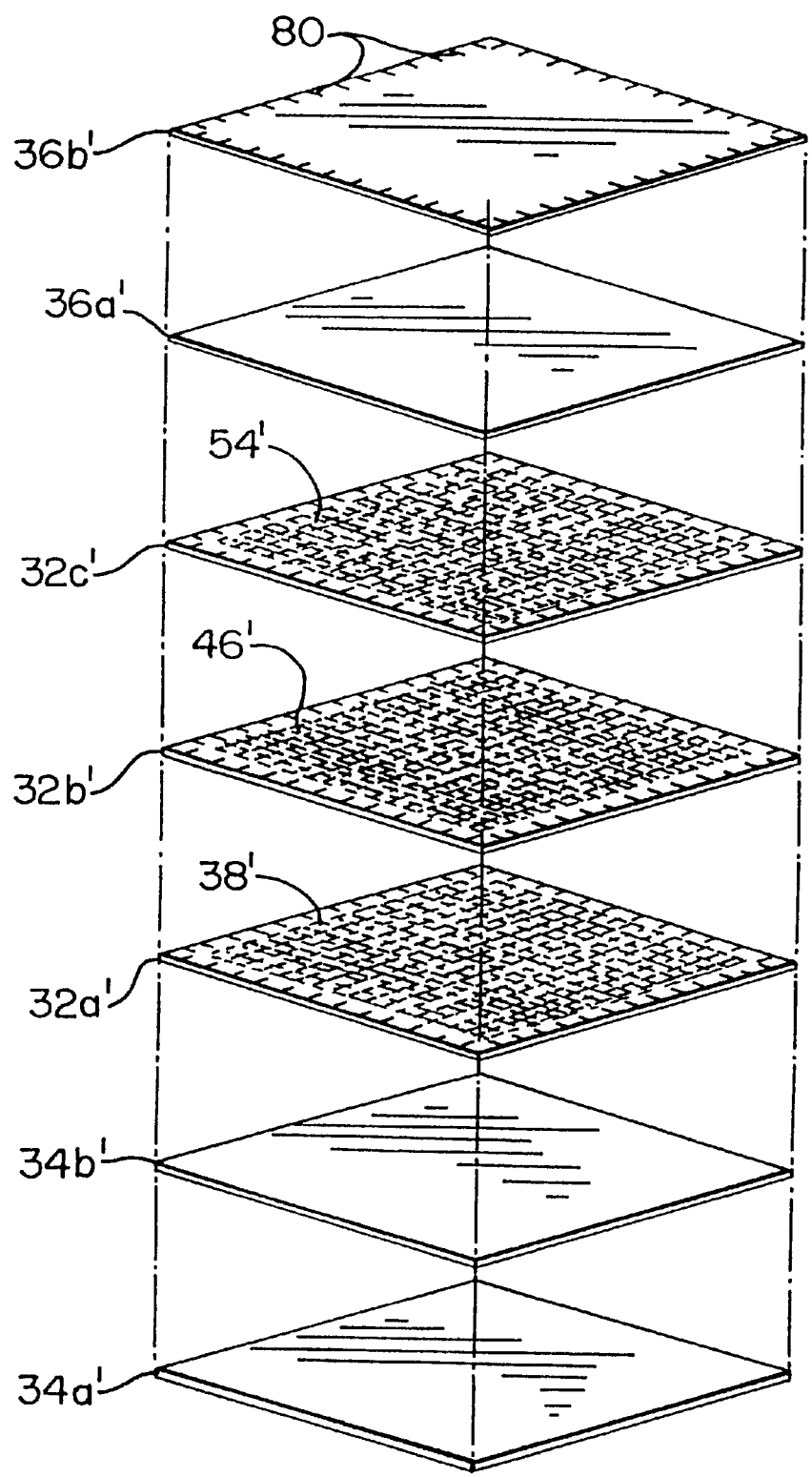
FIG. 9 is an exploded perspective view of individual ferrite layers and electrical conductors used to produce a plurality of electromagnetic interference suppressors according to the method of the present invention.

A method for mass producing a plurality of EMI suppressors is now discussed with reference to FIG. 9. Each ferrite layer 32a–c' is preferably a ductile ferrite layer manufactured with a modified ferrite powder which is intimately mixed with a suitable organic binder. The ductile ferrite tape is then cut to a specific size, preferably on the order of 3"×3" to 8"×8". Each of the ferrite layers 32a–c' is then punched with a respective pattern of via holes or openings, and the interior wall portions of these via holes are covered with a conductive material, such as silver, by applying a vacuum. Electrical conductor patterns 38', 46'and 54 are then printed on respective ferrite layers 32a–c'. Each of these conductor patterns corresponds to the electrical conductors 38, 46, and 54 illustrated in FIG. 2.

All printed layers are printed with an ink which contains a finely divided metal powder dispersed in an organic vehicle that has been formulated to provide relatively thick uniform prints that dry to a thickness of at least 0.005 inches and sinter to a thickness of at least 0.002 inches. The metal powder, preferably silver powder, has a low electrical resistance and does not react adversely with the constituents of the ferrite material.

Ferrite layers 34a–b' are provided as lower protective layers, and layers 36a–b' are provided as upper protective layers. Upper protective layer 36b' is printed with top cutting targets 80. The top cutting targets define the boundaries of the individual EMI suppressors with the layers, allowing the individual EMI suppressors to be cut apart after assembly.

The ferrite layers discussed above are then stacked as illustrated in FIG. 9 and loaded into a laminating die. The stacked layers are laminated at a pressure (approximately 1000 PSI) and temperature (approximately 50C) sufficient to form the ferrite layers 32a–c', 34a–b' and 36a–b' around the thick electrical conductor patterns 38', 46', and 54' creating the monolithic ferrite body. This ferrite body is then cut with a sharp blade or wheel along the top cutting targets 80 so that each of the individual EMI suppressors is separated as would be readily understood by those skilled in the art.

Each of the individual EMI suppressors is then sintered in a kiln employing a temperature profile that first permits the organic binders of both the ferrite layers and the electrical conductor printing ink to be safely removed without disrupting the monolithic structure. The temperature profile then allows the ferrite powder and the electrical conductor powder to shrink and sinter in a compatible manner.

This process creates a plurality of individual EMI suppressors having a first end 40 of the lower conductor path 38 and a second end 58 of the upper electrical conductor 54 exposed on opposite ends of the suppressor. Accordingly, each end of the suppressor is coated with an electrically conductive material to create conductors 24 and 26 as shown in FIG. 1.

The conductors 24 and 26 an be formed by successively dipping each end of the suppressor in a paste containing a metal powder such as silver or a mixture or alloy of palladium and silver and a glass frit. The glass frit allows the metal to be fused to the ferrite at a temperature lower than the sintering temperature of the ferrite body and the metal of conductors 24 and 26. The metal and frit are dispersed in an organic vehicle that facilitates the dipping process and can be uniformly removed when fired in a kiln. The suppressor with conductors 24 and 26 are then fired in a kiln at a temperature dependent upon the melting temperature of the alloy sufficient to fuse the metal conductors. The external conductors 24 and 26 can be electroplated with nickel, solder or other materials as would be readily understood by those skilled in the art. The EMI suppressors discussed above can be bulk packed, or packaged in a tape and reel format for automatic assembly on a circuit board.

In the drawings and specifications, there have been disclosed typical preferred embodiments of the invention and, although specific terms are employed, they are used in a generic and descriptive sense only and not for purposes of limitation, the scope of the invention being set forth in the following claims.

What is claimed is:

1. A surface mount electromagnetic interference suppressor for carrying a relatively high current and comprising:
    a lower ferrite layer, at least one intermediate ferrite layer, and an upper ferrite layer arranged in stacked relation and joined together to define a substantially rectangular ferrite body;
    a lower electrical conductor extending laterally between the lower ferrite layer and an adjacent intermediate ferrite layer, said lower electrical conductor comprising an elongate portion having a first end terminating at a first end of the substantially rectangular ferrite body, and an enlarged width portion connected to a second end of the elongate portion;
    an intermediate ferrite layer positioned adjacent the lower ferrite layer and having at least one first via opening extending vertically through the intermediate ferrite layer and in substantial registry with the enlarged width portion of said lower electrical conductor;
    a respective at least one first vertical electrical conductor extending through and covering interior wall portions of the at least one first via opening of the intermediate ferrite layer and being connected to the enlarged width portion of the lower electrical conductor;
    an intermediate electrical conductor extending laterally on the intermediate ferrite layer, the intermediate electrical conductor comprising a first enlarged width portion substantially overlying the at least one first vertical electrical conductor and being connected thereto, an elongate portion having a first end connected to the first enlarged width portion, and a second enlarged width portion connected to a second end of the elongate portion;
    the upper ferrite layer having at least one second via opening extending vertically therethrough and in substantial registry with an enlarged width portion of an adjacent intermediate electrical conductor;
    a respective at least one second vertical electrical conductor extending through and covering interior wall portions of the at least one second via opening of said upper ferrite layer and being connected to the enlarged width portion of the adjacent intermediate electrical conductor;
    an upper electrical conductor extending laterally along the upper ferrite layer and comprising an enlarged width portion substantially overlying the at least one second vertical electrical conductor and being connected thereto, and an elongate portion having a first end connected to said enlarged width portion and a second end terminating at a second end of the substantially rectangular ferrite body; and
    a pair of electrical conductors on respective first and second ends of the substantially rectangular ferrite body and connected to respective adjacent ends of the elongate portions of said lower and upper electrical conductors to facilitate surface mounting of the electromagnetic interference suppressor;
    each elongate portion of said lower, intermediate, and upper electrical conductors defining a predetermined cross-sectional area for carrying a relatively high current; and
    each at least one first and second vertical electrical conductor defining a cross-sectional area at least twice as great as said predetermined cross-sectional area so that misalignment with a respective enlarged width portion still permits the electromagnetic interference suppressor to carry the relatively high current.

2. A surface mount electromagnetic interference suppressor according to claim 1, wherein the predetermined cross-sectional area is at least about $2 \times 10^{-4}$ cm$^2$.

3. A surface mount electromagnetic interference suppressor according to claim 1, wherein each of said elongate portions of said lower, intermediate, and upper electrical conductors has a thickness in a vertical direction greater than about 0.08 times a width thereof.

4. A surface mount electromagnetic interference suppressor according to claim 1, wherein each of said lower, intermediate and upper electrical conductors is generally U-shaped defining three generally linear segments having outer edges spaced inwardly from adjacent edges of a respective ferrite layer.

5. A surface mount electromagnetic interference suppressor according to claim 4, wherein each of said enlarged width portions of said lower, intermediate, and upper electrical conductors has an outer edge generally aligned with an adjacent outer edge of the elongate portion.

6. An electromagnetic interference suppressor for carrying a relatively high current and comprising:
    a lower ferrite layer, at least one intermediate ferrite layer, and an upper ferrite layer arranged in stacked relation and joined together to define a substantially rectangular ferrite body;
    a lower electrical conductor extending laterally between the lower ferrite layer and an adjacent intermediate ferrite layer, said lower electrical conductor being generally U-shaped and comprising an elongate portion having a first end terminating at a first end of the substantially rectangular ferrite body, and an enlarged width portion connected to a second end of the elongate portion;

an intermediate ferrite layer positioned adjacent the lower ferrite layer and having at least one first via opening extending vertically through the intermediate ferrite layer and in substantial registry with the enlarged width portion of the lower electrical conductor;

a respective at least one first vertical electrical conductor extending through and covering interior wall portions of the at least one first via opening of the intermediate ferrite layer and being connected to the enlarged width portion of the lower electrical conductor;

an intermediate electrical conductor extending laterally on the intermediate ferrite layer, the intermediate electrical conductor being generally U-shaped and comprising a first enlarged width portion substantially overlying the at least one first vertical electrical conductor and being connected thereto, an elongate portion having a first end connected to the first enlarged width portion, and a second enlarged width portion connected to a second end of the elongate portion;

the upper ferrite layer having at least one second via opening extending vertically therethrough and in substantial registry with an enlarged width portion of an adjacent intermediate electrical conductor;

a respective at least one second vertical electrical conductor extending through and covering interior wall portions of the at least one second via opening of said upper ferrite layer and being connected to the enlarged width portion of the adjacent intermediate electrical conductor; and an upper electrical conductor extending laterally along the upper ferrite layer, said upper electrical conductor being generally U-shaped and comprising an enlarged width portion substantially overlying the at least one second vertical electrical conductor and being connected thereto, and an elongate portion having a first end connected to said enlarged width portion and a second end terminating at a second end of the substantially rectangular ferrite body;

each elongate portion of said lower, intermediate, and upper electrical conductors defining a predetermined cross-sectional area for carrying a relatively high current; and each at least one first and second vertical electrical conductor defining a cross-sectional area at least twice as great as said predetermined cross-sectional area so that misalignment with a respective enlarged width portion still permits the electromagnetic interference suppressor to carry the relatively high current.

7. An electromagnetic interference suppressor according to claim 6, further comprising a pair of electrical conductors on respective first and second ends of the substantially rectangular ferrite body and connected to respective adjacent ends of the elongate portions of said lower and upper electrical conductors to facilitate surface mounting of the electromagnetic interference suppressor.

8. An electromagnetic interference suppressor according to claim 6, wherein the predetermined cross-sectional area is at least about $2\times10^{-4}$ cm$^2$.

9. An electromagnetic interference suppressor according to claim 6, wherein each of said elongate portions of said lower, intermediate, and upper electrical conductors has a thickness in a vertical direction greater than about 0.08 times a width thereof.

10. An electromagnetic interference suppressor according to claim 6, wherein each of said generally U-shaped lower, intermediate and upper electrical conductors is defined by three generally linear segments having outer edges spaced inwardly from adjacent edges of a respective ferrite layer.

11. An electromagnetic interference suppressor according to claim 10, wherein each of said enlarged width portions of said lower, intermediate, and upper electrical conductors has an outer edge generally aligned with an adjacent outer edge of the elongate portion.

12. An electromagnetic interference suppressor for carrying a relatively high current and comprising:

a plurality of ferrite layers arranged in stacked relation and joined together to define a substantially rectangular ferrite body, an intermediate one of said plurality of ferrite layers having at least one via opening extending vertically therethrough;

a respective vertical electrical conductor extending through and covering interior wall portions of the at least one via opening of the intermediate ferrite layer; and an intermediate electrical conductor extending laterally on the intermediate ferrite layer, the intermediate electrical conductor comprising a first enlarged width portion substantially overlying the at least one vertical electrical conductor and being connected thereto, an elongate portion having a first end connected to the first enlarged width portion, and a second enlarged width portion connected to a second end of the elongate portion, the elongate portion of said intermediate conductor defining a predetermined cross-sectional area for carrying a relatively high current therethrough;

said at least one vertical conductor defining a cross-sectional area at least twice as great as the predetermined cross-sectional area of the elongate portion of said intermediate electrical conductor so that misalignment with a respective enlarged width portion still permits the electromagnetic interference suppressor to carry the relatively high current.

13. An electromagnetic interference suppressor according to claim 12, wherein the predetermined cross-sectional area is at least about $2\times10^{-4}$ cm$^2$.

14. An electromagnetic interference suppressor according to claim 12, wherein the elongate portions of said intermediate electrical conductor has a thickness in a vertical direction greater than about 0.08 times a width thereof.

15. An electromagnetic interference suppressor according to claim 12, wherein said intermediate electrical conductor is generally U-shaped defining three generally linear segments having outer edges spaced inwardly from adjacent edges of the intermediate ferrite layer.

16. An electromagnetic interference suppressor according to claim 15, wherein each of said enlarged width portions of said intermediate electrical conductor has an outer edge generally aligned with an adjacent outer edge of the elongate portion of said lower, intermediate, and upper conductors.

17. An electromagnetic interference suppressor according to claim 12, further comprising a pair of electrical conductors on respective first and second ends of the substantially rectangular ferrite body to facilitate surface mounting of the electromagnetic interference suppressor.

18. A method for making an electromagnetic interference suppressor for carrying a relatively high current and comprising:

providing a plurality of ferrite layers;

forming at least one via opening extending vertically through an intermediate ferrite layer;

covering interior wall portions of the at least one via opening of the intermediate ferrite layer with a conductive material to thereby define a respective vertical electrical conductor;

forming an intermediate electrical conductor extending laterally on the intermediate ferrite layer having a first enlarged width portion substantially overlying at the least one vertical electrical conductor and being connected thereto, an elongate portion having a predetermined cross-sectional area for carrying a relatively high current therethrough and a first end connected to the first enlarged width portion, and a second enlarged width portion connected to a second end of the elongate portion;

arranging the plurality of ferrite layers in stacked relation and joining the ferrite layers together to define a substantially rectangular ferrite body; and wherein the step of forming the at least one via opening comprises forming same to have a cross-sectional area at least twice as great as the predetermined cross-sectional area of the elongate portion of the intermediate electrical conductor so that misalignment of the at least one via opening with a respective enlarged width portion still permits the electromagnetic interference suppressor to carry the relatively high current.

19. A method according to claim 18, further comprising the steps of forming a lower electrical conductor on a lower ferrite layer, forming an upper electrical conductor on an upper ferrite layer, and connecting the lower and upper electrical conductors to the intermediate electrical conductor.

20. A method according to claim 19, further comprising the step of forming a pair of electrical conductors on opposite ends of the ferrite body and connected to the lower and upper electrical conductors to facilitate surface mounting of the electromagnetic interference suppressor.

21. A method according to claim 18, wherein the step of forming the elongate portion of the intermediate conductor comprises forming same to have a predetermined cross-sectional area at least about $2 \times 10^{-4}$ cm$^2$.

22. A method according to claim 18, wherein the step of forming the intermediate electrical conductor comprises forming same so that the elongate portion thereof has a thickness in a vertical direction greater than about 0.08 times a width thereof.

23. A method according to claim 18, wherein the step of forming the intermediate electrical conductor comprises forming same to have a generally U-shaped defining three generally linear segments having outer edges spaced inwardly from adjacent edges of the intermediate ferrite layer.

24. A method according to claim 18, wherein the step of forming each of the enlarged width portions of the intermediate electrical conductor comprises forming same to have an outer edge generally aligned with an adjacent outer edge of the elongate portion.

* * * * *